United States Patent
Lesso et al.

(10) Patent No.: US 10,863,284 B2
(45) Date of Patent: Dec. 8, 2020

(54) METHODS AND APPARATUSES FOR DRIVING AUDIO AND ULTRASONIC SIGNALS FROM THE SAME TRANSDUCER

(71) Applicant: Cirrus Logic International Semiconductor Ltd., Edinburgh (GB)

(72) Inventors: John Paul Lesso, Edinburgh (GB); Cedric Andrieu, Edinburgh (GB); Calum Cuthill, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 375 days.

(21) Appl. No.: 15/830,358

(22) Filed: Dec. 4, 2017

(65) Prior Publication Data

US 2018/0160235 A1  Jun. 7, 2018

Related U.S. Application Data

(60) Provisional application No. 62/430,605, filed on Dec. 6, 2016, provisional application No. 62/577,879, filed on Oct. 27, 2017.

(30) Foreign Application Priority Data

Mar. 28, 2017  (GB) .................................. 1704979.2

(51) Int. Cl.
*H04R 23/00* (2006.01)
*H04B 1/04* (2006.01)
*H04B 11/00* (2006.01)
*H04R 3/04* (2006.01)
(Continued)

(52) U.S. Cl.
CPC .......... *H04R 23/00* (2013.01); *G01S 7/52004* (2013.01); *G01S 7/524* (2013.01);
(Continued)

(58) Field of Classification Search
CPC ...... H04R 23/00; H04R 3/04; H04R 2420/01; H04R 2499/11; H04B 1/04; H04B 11/00; G01S 15/10; G01S 7/524; G01S 7/52004
(Continued)

(56) References Cited

U.S. PATENT DOCUMENTS

| | | | |
|---|---|---|---|
| 5,758,173 A | 5/1998 | Evoy | |
| 6,122,223 A * | 9/2000 | Hossack | ............ G01N 29/2456 367/11 |

(Continued)

FOREIGN PATENT DOCUMENTS

| | | |
|---|---|---|
| CN | 102540191 A | 7/2012 |
| EP | 2852057 A1 | 3/2015 |
| JP | 2005151422 A | 6/2005 |

OTHER PUBLICATIONS

International Search Report and Written Opinion of the International Searching Authority, International Application No. PCT/GB2017/053654, dated Apr. 17, 2018.
(Continued)

*Primary Examiner* — Xu Mei
(74) *Attorney, Agent, or Firm* — Jackson Walker L.L.P.

(57) ABSTRACT

Driver circuitry is disclosed for driving an electroacoustic transducer to provide an output comprising both ultrasonic and audio signal components. The driver circuitry comprises an adjustment module configured to reduce the level of said ultrasonic component signal in response to an increase in an operational variable indicative of a level of said audio signal component, while also increasing the pulse duration, duty cycle, repetition frequency or frequency span or bandwidth of the ultrasonic component.

22 Claims, 14 Drawing Sheets

(51) Int. Cl.
    *H03G 3/20*     (2006.01)
    *H03G 3/00*     (2006.01)
    *G01S 7/52*     (2006.01)
    *G01S 7/524*     (2006.01)
    *G01S 15/10*     (2006.01)

(52) U.S. Cl.
    CPC ............ *G01S 15/10* (2013.01); *H03G 3/005* (2013.01); *H03G 3/20* (2013.01); *H04B 1/04* (2013.01); *H04B 11/00* (2013.01); *H04R 3/04* (2013.01); *H04R 2420/01* (2013.01); *H04R 2499/11* (2013.01)

(58) Field of Classification Search
    USPC .............. 381/77, 79, 111, 117; 367/137, 138
    See application file for complete search history.

(56) References Cited

U.S. PATENT DOCUMENTS

| | | | |
|---|---|---|---|
| 9,456,271 B2 * | 9/2016 | Lim | .......................... H04R 3/00 |
| 2007/0170984 A1 * | 7/2007 | Andersen | .............. H03F 1/3264 |
| | | | 330/10 |
| 2007/0223724 A1 | 9/2007 | Miyazaki | |
| 2015/0085620 A1 * | 3/2015 | Macours | .............. H03G 3/3005 |
| | | | 367/199 |

OTHER PUBLICATIONS

Combined Search and Examination Report under Sections 17 and 18(3), UKIPO, Application No. GB1704979.2, dated May 23, 2017.

* cited by examiner

METHODS AND APPARATUSES FOR DRIVING AUDIO AND ULTRASONIC SIGNALS FROM THE SAME TRANSDUCER

FIELD

The field of representative embodiments of this disclosure relates to methods, apparatuses, or implementations concerning or relating to driving ultrasonic and audio signals from the same transducer without introducing audible artefacts.

BACKGROUND

Recent devices such as smartphones are being provided with ultrasonic transmission and detection capabilities to enable functions such as proximity detection and gesture recognition inter alia.

FIG. 1 illustrates a smartphone 10 comprising a loudspeaker 20, which is supplied with audio signals such as voice or music from audio processing circuitry 30 and ultrasonic signals from ultrasonic processing circuitry 35, and which transmits a combined acoustic output 91. The device may also comprise a control or applications processor 40 and a module 45 for receiving radio frequency signals for communication with a local network or a public telecommunications network. The smartphone 10 may also comprise a microphone 50 to receive reflected waves 92 which may comprise audio signals such as a user's voice or ultrasonic return signals reflected from some nearby object 90. Using the same transducer 20 to generate both audio and ultrasonic acoustic signals may save material and assembly cost and allow reduced dimensions or allow space for extra functions on device 10.

However, when audio and ultrasonic signals are driven from the same transducer audible distortion may be heard by the user. For instance, as illustrated in FIG. 2, an audio tone at 9 kHz may interact with an ultrasonic tone at 22 kHz to give intermodulation products at 22 kHz±9 kHz, which will thus provide audible components at 13 kHz, as well as an ultrasonic intermodulation component at 31 kHz. Further intermodulation products may occur at e.g. 22 kHz−(2×9 kHz)=4 kHz. This interaction between the original tones may be caused by non-linearities due to a variety of mechanical, electrical and acoustic effects including for example excursion limits or non-linearities in transducer parameters such as the force factor (Bl) or the membrane compliance Rms.

Such intermodulation products are generally not harmonically related to the original audio frequency, so are particularly subjectively objectionable. Also in some embodiments the ultrasonic signal may be a swept frequency stimulus such as a chirp or may be modulated in frequency according to some digital or analog data, which may lead to the intermodulation products also changing in frequency over time and becoming more noticeable. In many applications the ultrasonic signal may be in the form of periodic bursts of signal which may generate a more complex spectrum and may thus also generate additional intermodulation artifacts.

SUMMARY

According to an aspect of the invention, there is provided driver circuitry, configurable to provide an output signal comprising an ultrasonic component and an audio signal component, the driver circuitry comprising:

an ultrasonic signal generation module, responsive to an operational variable indicative of a level of said audio signal component, for generating the ultrasonic component with an amplitude, and a pulse duration, duty cycle, repetition frequency or frequency span or bandwidth, that are dependent on the level of said audio signal component, such that a higher level of said audio signal component leads to a lower amplitude, and a higher pulse duration, duty cycle, repetition frequency or frequency span or bandwidth of the ultrasonic component, and a lower level of said audio signal component leads to a higher amplitude, and a lower pulse duration, duty cycle, repetition frequency or frequency span or bandwidth of the ultrasonic component.

Said level of said audio component may be indicated by an operational variable indicating the presence of an audio input signal receivable at an input, or by an operational variable indicating the level of an upstream volume control applied to an audio signal prior to receiving the audio input signal receivable at an input, or by an operational variable indicating the level of a gain to be applied to an audio input signal received at an input to provide said audio signal component, or by an operational variable derived from an audio input signal received at an input, or by an operational variable derived from an acousto-electrical transducer monitoring an acoustic output of the electroacoustic transducer.

Said driver circuitry may also comprise: an input for receiving an ultrasonic input signal; and said ultrasonic signal generation module may be configured to control the level of said ultrasonic component signal by applying a controlled gain to said ultrasonic input signal.

Said ultrasonic signal generation module may be configured to generate an ultrasonic source signal and to generate the ultrasonic component signal by altering an amplitude of the ultrasonic source signal.

The ultrasonic signal generation module may be configured to generate the ultrasonic source signal from a stored waveform. The stored waveform may comprise the waveform of a signal burst.

The ultrasonic signal generation module may be configured to generate the stored waveform, on re-initialization, and store it for subsequent use.

The ultrasonic signal generation module may be configured to generate the stored waveform based on a random bit sequence.

The ultrasonic signal generation module may be configured to generate the ultrasonic source signal from a waveform received from an external source.

Said ultrasonic signal generation module may be configured to generate the ultrasonic component with a required amplitude, and with a required pulse duration, duty cycle, repetition frequency and frequency span or bandwidth.

Said ultrasonic signal generation module may be configured to generate the ultrasonic component signal by selecting from a plurality of stored waveforms corresponding to a set of respective required characteristics.

Said ultrasonic signal generation module may comprise a first waveform generator and a second waveform generator, and the ultrasonic signal generation module may be configured to generate the ultrasonic component as an output either of the first waveform generator or of the second waveform generator, based on a value of said operational variable.

The first waveform generator may be configured for generating a waveform of a first type and the second waveform generator may be configured for generating a waveform of a second type, wherein the second type of waveform is simpler than the first type, and wherein the ultrasonic signal generation module may be configured to generate the ultrasonic component as an output of the first waveform generator when the value of said operational variable indicates that the level of said audio signal component is above a threshold level.

The waveform of the first type may be a wideband noise-like waveform.

The first waveform generator may comprise: a digital noise generator, for generating a noise sequence of values; a band-pass filter, for receiving the noise sequence and limiting the bandwidth thereof to an ultrasonic range; and a window for selecting a set of samples output from the band-pass filter, corresponding to a required pulse duration.

The digital noise generator may comprise a pseudo-random bit sequence generator, for generating a random sequence of values with a flat wideband frequency spectrum.

The required pulse duration, and an amplitude of the waveform, may be adjustable.

The bandwidth of the waveform may be adjustable.

The waveform of the second type may be a chirp.

The waveform of the second type may be a single tone.

The ultrasonic component may comprise a plurality of bursts, and at least the amplitude of the ultrasonic component may be kept constant during each burst, and be variable between bursts.

The driver circuitry may further comprise: a first input for receiving an audio source signal; and an output for providing electrical signal components to be applied to said transducer.

Said operational variable of the audio component electrical signal may be indicative of the amplitude of an envelope of the audio component electrical signal. Said envelope may be derived according to an attack time, a decay time or a hold time.

The ultrasonic signal generation module may comprise a variable gain module configured to apply a variable gain to an ultrasonic source signal according to a gain control signal based on the parameter of the audio source signal.

The variable gain module may comprise a digital multiplier for applying the variable gain to the ultrasonic source signal.

The variable gain module may comprise a digital-to-analogue converter employing a reference voltage which is adjusted for applying the variable gain to the ultrasonic source signal.

The driver circuitry may comprise a combining module for combining the ultrasonic and audio signal component electrical signals before application to the transducer.

According to an aspect of the invention, there is provided driver circuitry, comprising:
 a waveform generator, wherein the waveform generator comprises:
 a digital noise generator, for generating a noise sequence of values;
 a band-pass filter, for receiving the noise sequence and limiting the bandwidth thereof to an ultrasonic range; and
 a window for selecting a set of samples output from the band-pass filter, corresponding to a required pulse duration.

The digital noise generator may comprise a pseudo-random bit sequence generator, for generating a random sequence of values with a flat wideband frequency spectrum.

The band-pass filter may limit the bandwidth of the pseudo-random bit sequence to an ultrasonic frequency range.

The window may be a Gaussian time window.

The driver circuitry may further comprise a memory for storing the selected set of samples. The driver circuitry may then further comprise an output for repeatedly generating pulses from the stored selected set of samples.

The repetition rate of said pulses may be adjustable, the bandwidth of said pulses may be adjustable, the duty cycle of said pulses may be adjustable, and/or the duration of said pulses may be adjustable.

The driver circuitry may further comprise a gain element, for altering sample values of the selected set of samples, wherein the memory is connected to the gain element for storing the selected set of samples with altered sample values.

According to an aspect of the invention, there is provided driver circuitry for driving an electroacoustic transducer to concurrently provide ultrasonic and audio acoustic signal components, comprising:
 a first input for receiving an audio source signal;
 an output for providing electrical signal components to be applied to said transducer, said electrical signal components comprising an audio component electrical signal derived from said audio source signal and an ultrasonic component electrical signal;
 parameter estimation circuitry configured to provide an operational variable based on the voltage and current of the electroacoustic transducer and a plant model of the electroacoustic transducer; and
 an ultrasonic generation module for providing said ultrasonic component electrical signal with a level dependent on said operational variable.

A repetition rate of pulses of said ultrasonic component may be dependent on said operational variable, a bandwidth of pulses of said ultrasonic component may be dependent on said operational variable, a duty cycle of pulses of said ultrasonic component is dependent on said operational variable, and/or a duration of pulses of said ultrasonic component may be dependent on said operational variable.

Said operational variable may comprise one or more of: the displacement of a membrane, velocity of a membrane, acceleration of a membrane, temperature of a voice coil, or estimated SPL of speaker.

According to an aspect of the invention, there is provided an electronic device comprising such driver circuitry.

According to an aspect of the invention, there is provided a method of generating a transducer drive signal comprising an ultrasonic component and an audio signal component, the method comprising:
 determining an operational variable indicative of a level of the audio signal component; and
 generating the ultrasonic component with an amplitude, and a pulse duration, duty cycle, repetition frequency or frequency span or bandwidth, that are dependent on the level of said audio signal component, such that a higher level of said audio signal component leads to a lower amplitude, and a higher pulse duration, duty cycle, repetition frequency or frequency span or bandwidth of the ultrasonic component, and a lower level of said audio signal component leads to a higher amplitude, and a lower pulse duration, duty cycle, repetition frequency or frequency span or bandwidth of the ultrasonic component.

According to an aspect of the invention, there is provided a computer program, comprising computer-readable code for causing a processor to perform the method.

According to an aspect of the invention, there is provided an electronic device, comprising a processor and a memory, the memory storing the computer program, for causing the processor to perform the method.

According to an aspect of the invention, there is provided driver circuitry for driving an electroacoustic transducer to provide an output comprising both ultrasonic and audio signal components, said driver circuitry comprising:

an adjustment module configured to reduce the level of said ultrasonic component signal in response to an increase in an operational variable indicative of a level of said audio signal component.

Said increase in level of said audio component is indicated by an operational variable derived from an audio input signal received at an input.

Said increase in level of said audio component is indicated by an operational variable derived from an acousto-electrical transducer monitoring an acoustic output of the electroacoustic transducer.

Said driver circuitry may also comprise:
an input for receiving an ultrasonic input signal; and
said adjustment module may be configured to reduce the level of said ultrasonic component signal by applying a controlled gain to said ultrasonic input signal.

Said adjustment module may be configured to generate an ultrasonic source signal and to reduce the level of said ultrasonic component signal by generating a reduced amplitude ultrasonic source signal.

Said adjustment module may be configured to increase the pulse duration, repetition frequency or frequency span of said ultrasonic component signal when reducing the amplitude of said ultrasonic component signal.

According to an aspect of the invention, there is provided driver circuitry for driving an electroacoustic transducer to provide an output comprising simultaneous ultrasonic and audio signal components, said driver circuitry comprising:
an adjustment module for reducing the level of said ultrasonic component signal in response to a comparison of an audio input signal and an estimated acoustic audio output.

Said estimated acoustic audio output may be estimated based on the voltage and current of the electroacoustic transducer and a plant model of the electroacoustic transducer.

Said estimated acoustic audio output may be estimated based on the electrical output of an acousto-electrical transducer.

According to an aspect of the invention, there is provided driver circuitry for driving an electroacoustic transducer to concurrently provide ultrasonic and audio acoustic signal components, comprising:
 a first input for receiving an audio source signal;
 an output for providing electrical signal components to be applied to said transducer, said electrical signal components comprising an audio component electrical signal derived from said audio source signal and an ultrasonic component electrical signal; and
 an adjustment module for providing said ultrasonic component electrical signal configured to adjust a level of said ultrasonic component electrical signal based on an operational variable indicative of the level of the audio component electrical signal,
 wherein said adjustment module reduces the amplitude of said adjusted ultrasonic component electrical signal when a higher level of the audio component electrical signal is indicated to be present.

Said operational variable of the audio component electrical signal may be indicative of the amplitude of an envelope of the audio component electrical signal. Said envelope may be derived according to an attack time, a decay time or a hold time.

The adjustment module may comprise a variable gain module configured to apply a variable gain to the ultrasonic source signal according to a gain control signal based on the parameter of the audio source signal.

The variable gain module may comprise a digital multiplier for applying the variable gain to the ultrasonic source signal.

The variable gain module may comprise a digital-to-analogue converter employing a reference voltage which is adjusted for applying the variable gain to the ultrasonic source signal.

The driver circuitry may comprise a combining module for combining the ultrasonic and audio signal component electrical signals before application to the transducer.

Said adjustment module may be configured to increase the pulse duration, repetition frequency or frequency span of said ultrasonic component signal when reducing the amplitude of said ultrasonic component signal.

According to an aspect of the invention, there is provided driver circuitry for driving an electroacoustic transducer to concurrently provide ultrasonic and audio acoustic signal components, comprising:
 a first input for receiving an audio source signal;
 an output for providing electrical signal components to be applied to said transducer, said electrical signal components comprising an audio component electrical signal derived from said audio source signal and an ultrasonic component electrical signal;
 parameter estimation circuitry configured to provide an operational variable indicative of the acoustic signal output of the transducer; and
 an adjustment module for providing said ultrasonic component electrical signal configured to adjust a level of said ultrasonic component electrical signal based on said operational variable.

Said operational variable may be derived based on the electrical output of an acousto-electrical transducer.

Said operational variable may be derived based on the voltage and current of the electroacoustic transducer and a plant model of the electroacoustic transducer.

Said operational variable may comprise one or more of: the displacement of a membrane, velocity of a membrane, acceleration of membrane temperature of voice coil estimated SPL of speaker.

The adjustment of the level of said ultrasonic component electrical signal may be based on a comparison signal derived from the audio input signal and said operational variable.

The adjustment of the level of the ultrasonic component electrical signal may be based on an adaptive iterative method.

The adjustment module may also be configured to apply a non-linearity to said ultrasonic component electrical signal.

According to an aspect of the invention, there is provided driver circuitry for generating an ultrasound signal to be applied to a loudspeaker, wherein the ultrasound signal is controlled based on an operational variable indicative of a property of an audio signal concurrently applied to the loudspeaker.

An amplitude, frequency spectrum or time domain feature of the ultrasound signal may be controlled based on said operational variable.

The operational variable may be based on an input audio signal from which said audio signal is derived.

The driver circuitry may further comprise circuitry for detecting sound generated by the loudspeaker, wherein the ultrasound signal is controlled based on the detected sound generated by the loudspeaker.

The driver circuitry may further comprise circuitry for detecting one or more operational parameter of the loudspeaker, wherein the ultrasound signal is controlled based on the detected one or more operational parameter of the loudspeaker.

According to another aspect of the invention, there is provided an electronic device comprising driver circuitry according to any preceding aspect.

The electronic device may be at least one of: a portable device; a battery powered device; a communications device; a computing device; a mobile telephone; a laptop, notebook or tablet computer; a personal media player; a gaming device; and a wearable device.

DETAILED DESCRIPTION OF EMBODIMENTS

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

The embodiments relate to methods or apparatus which eliminate or significantly reduce audible distortion caused by electrical, mechanical or acoustic non-linearities in an electro-acoustic transducer when transmitting both an audio signal and an ultrasonic signal, by modifying the ultrasonic signal in response to the operational variables related to the audio signal at the input and/or the output.

For the purposes of this document, audio signals may be considered as those signals audible by a human, conventionally taken as up to 20 kHz, although some audio signals may be limited in bandwidth by pre-processing or channel limitations to extend to a lower maximum frequency, say 8 kHz or 3.4 kHz for example. We will refer to either an ultrasonic (>20 kHz) or near ultrasonic (e.g. in the upper half of the audio band) signal as an ultrasonic signal. "Acoustic" covers the pressure waves in a medium due to sound in both audio and higher ultrasonic bands, as contrasted to electrical signals which may represent such sounds.

Figure 1:
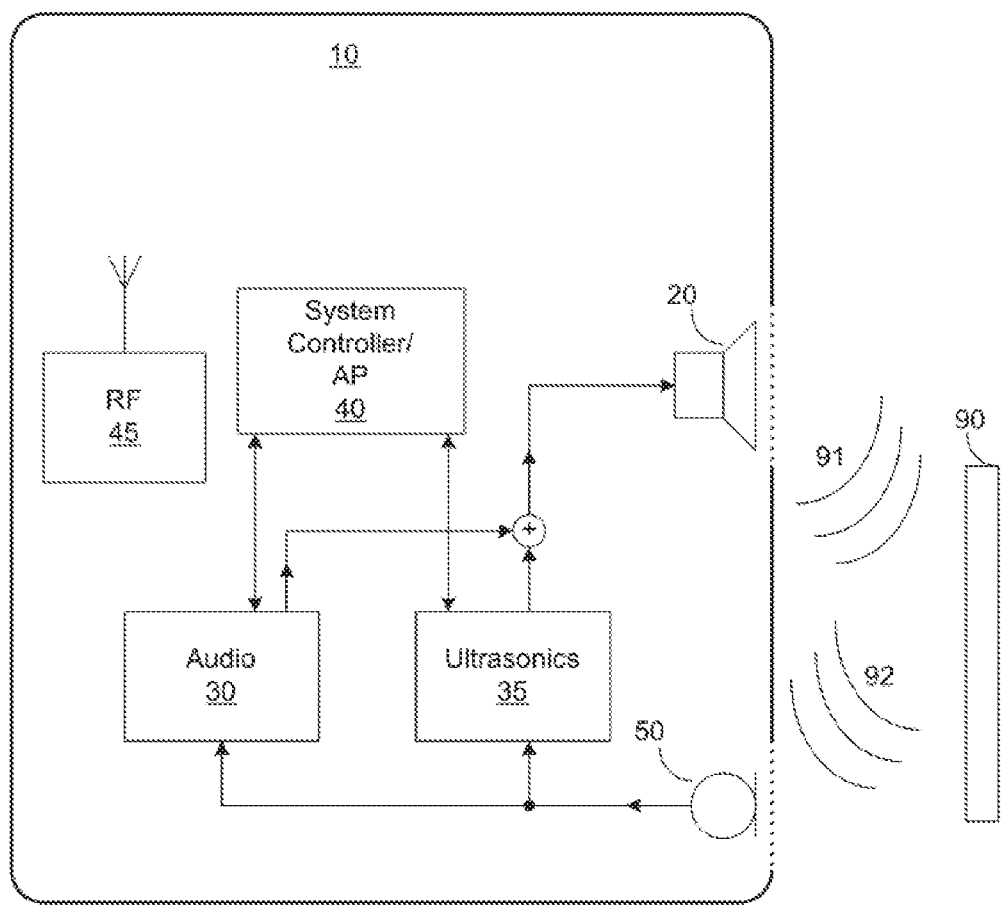
FIG. 1 is a schematic diagram illustrating a smartphone.
Figure 2:
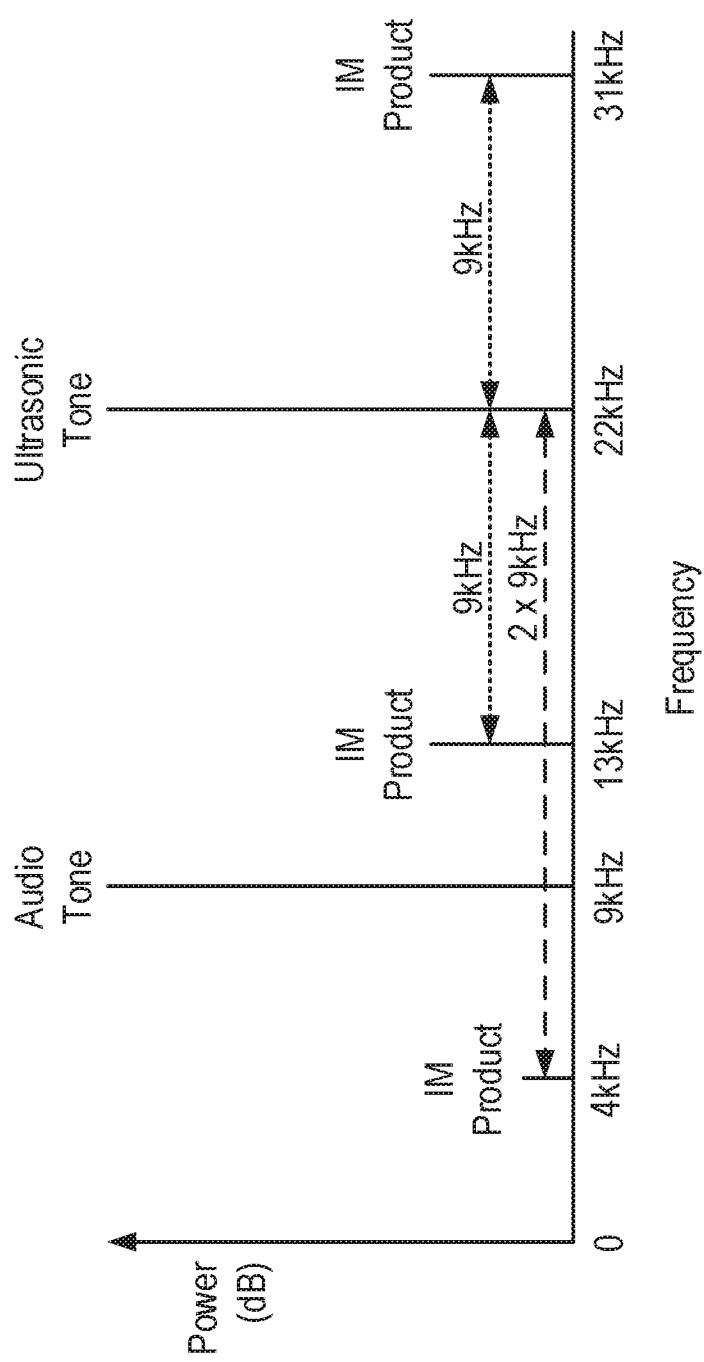
FIG. 2 illustrates audio and ultrasonic tones.
Figure 3:
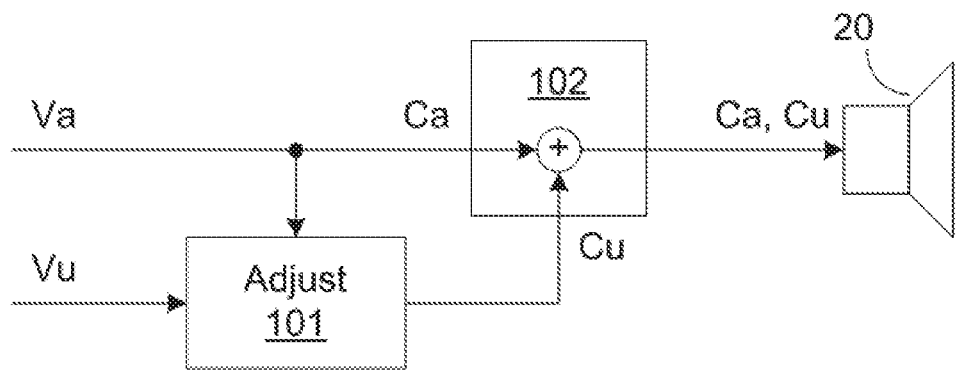
FIG. 3 illustrates an electroacoustic transducer and associated driver circuitry.

FIG. 3 illustrates an embodiment. An output electro-acoustic transducer for example a loudspeaker 20 receives a signal with audio band components Ca based on an audio source signal Va, and receives ultrasonic components Cu from an ultrasonic generation module 101. In this illustrated embodiment, an ultrasonic source signal Vu is adjusted or modified by the ultrasonic generation module 101 to provide Cu, and the adjustment is dependent on the input audio signal Va. The signal components Ca, Cu are combined in a combination block here illustrated as an adder 102.

In some embodiments the ultrasonic source signal may be generated within the ultrasonic generation module 101 rather than received from some other source. In some embodiments the required ultrasonic signal may be generated directly within the ultrasonic generation module 101, rather than an ultrasonic source signal being generated and then adjusted or modified.

There may be other signal processing (not illustrated) in the signal path between an audio source signal input where Va is received and the block 102 where the signal components are combined.

There may be some amplifier or digital-to-analogue circuitry upstream of and in series with the actual physical loudspeaker or transducer 20, not illustrated for simplicity.

Figure 4:
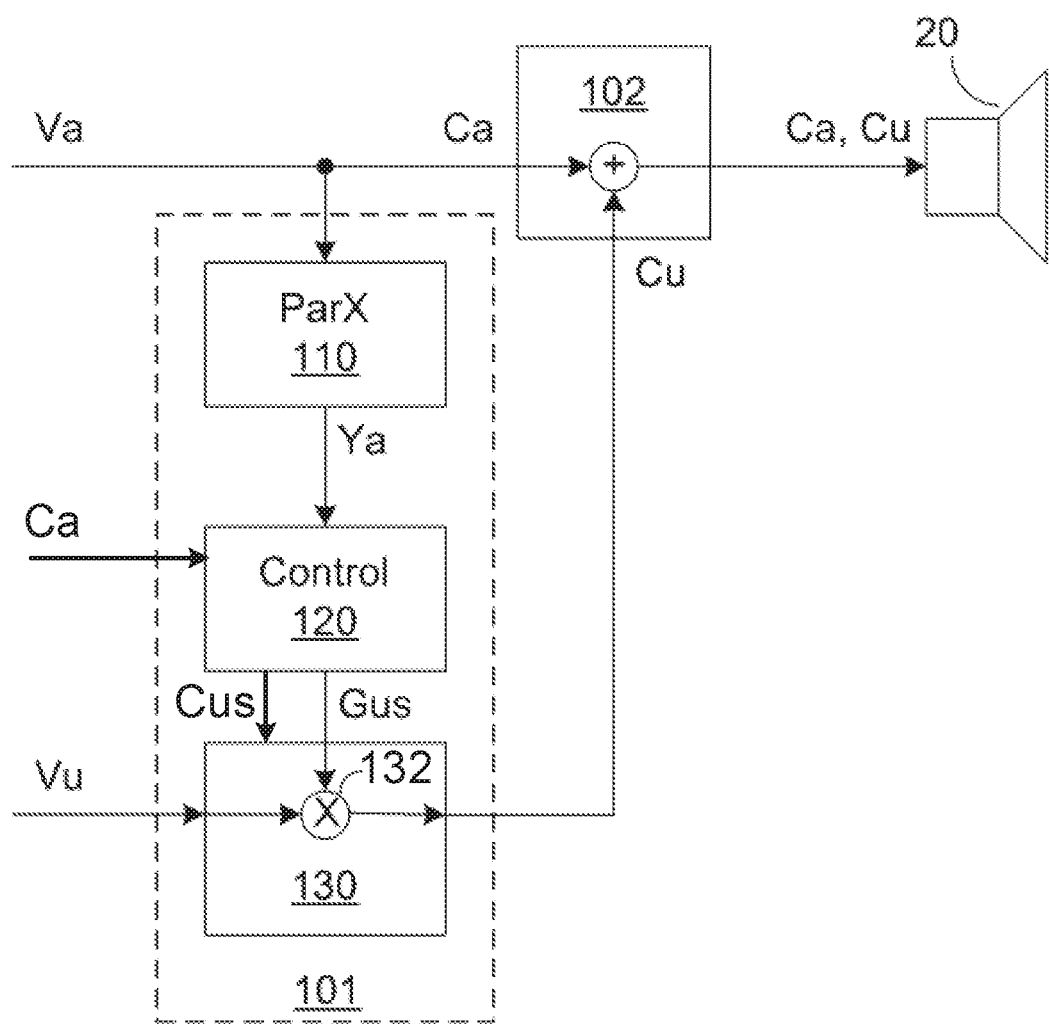
FIG. 4 illustrates a further electroacoustic transducer and associated driver circuitry.

FIG. 4 illustrates an embodiment in more detail. In this embodiment of the ultrasonic generation module 101, the audio source signal input is coupled to an audio parameter extraction module 110 coupled in turn to a control module 120 coupled in turn to a signal adjustment module 130. Audio parameter extraction module 110, for example an envelope detector, provides an audio signal parameter Ya based on the audio source signal. This parameter may be indicative of the level of the audio signal to be rendered as an acoustic signal by the transducer 20. Audio signal parameter Ya is received by control module 120, for instance a digital look-up table, which receives Ya and generates an ultrasonic gain value Gus. Ultrasonic gain value Gus is applied to control the signal adjustment module 130, comprising a variable gain stage 132, for instance comprising a digital multiplier or analog programmable gain amplifier, to apply a corresponding gain to the ultrasonic source signal Vu to generate the ultrasonic component signal Cu.

Thus, the ultrasonic signal may be modified by applying a gain to the ultrasonic input signal which is varied in response to a parameter or operational variable indicative of the level of the audio signal being played. In some embodiments, the ultrasonic component signal Cu may be generated directly within the adjustment module 101 with an amplitude corresponding to the gain value Gus, rather than an ultrasonic source signal being generated and then adjusted or modified by an explicit variable gain stage. In embodiments control module 120 may also generate other control signals Cus which may alter the output ultrasonic component signal Cu forwarded by signal adjustment module 130 to combination block 102, as described below.

Figure 5:
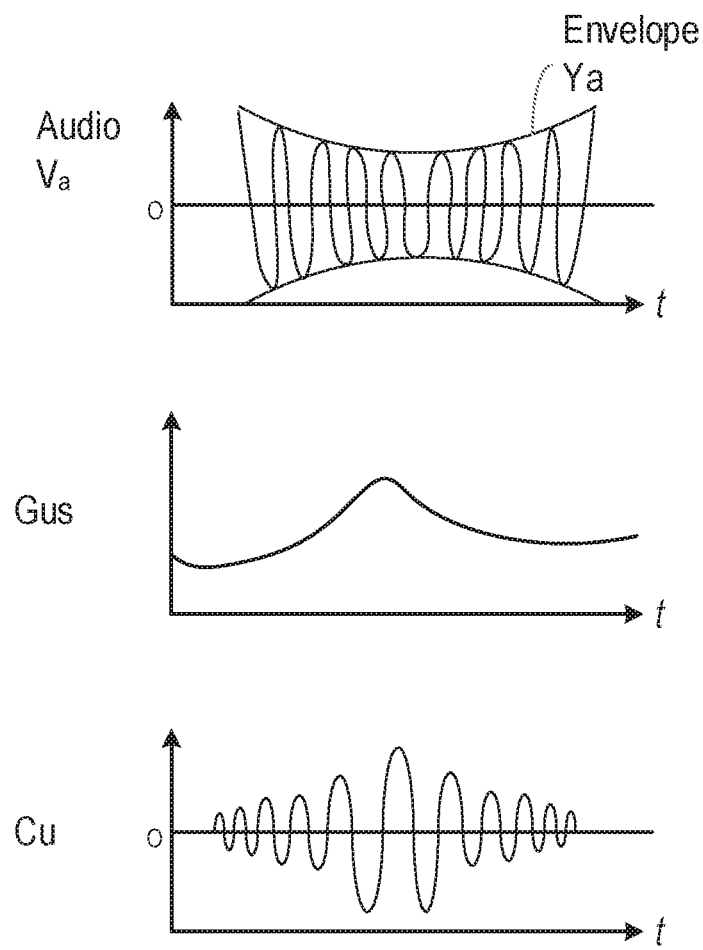
FIG. 5 shows an example of waveforms in the circuitry of FIG. 4.

FIG. 5 illustrates an example input audio source waveform Va, the resulting gain signal Gus, and resulting ultrasonic component signal Cu on upper, middle, and lower traces respectively. In this example, the audio signal parameter Ya is a short-term envelope of the audio source signal Va and the gain control module generates a gain that continuously and instantaneously follows the envelope signal and is immediately applied to the ultrasonic source signal.

Thus, during the time span illustrated the envelope Ya of the audio source signal Va in the upper trace decreases then increases. In response the gain control signal Gus in the middle trace increases then decreases, so that the amplitude of the ultrasonic component signal in the lower trace increases when the audio signal envelope decreases.

In embodiments, the ultrasonic signal may be of the form of bursts of signal. The gain applied to the signal may vary within each burst as illustrated in FIG. 5 or each burst may be subjected to a respective gain adjustment, constant during the duration of each burst.

In embodiments, the envelope detector may detect the amplitude of the input signal with an attack time, a decay time or a hold time. The attack time may be shorter than the decay time so as to allow a rapid response to any sudden increase in the audio signal. A hold time or decay time may be comparable to audio signal periods so that the envelope tracks the amplitude of the audio waveform in detail. Alternatively, a decay time or hold time may be deliberately longer than an audio signal period, for example longer than 10 ms, so that only the general long-term level of the audio signal is monitored, to avoid rapid modulation of the ultrasonic signal, which may itself generate sidebands in the ultrasonic component signal.

In some embodiments the gain applied to the ultrasonic component signal may be based on a volume control signal which may also control a gain applied to the audio source signal within the driver circuitry or may be upstream of the audio source input. The volume signal may be indicative of the level of the audio component signal corresponding to a full-scale or maximum signal anticipated to be provided as an original audio source signal.

In some embodiments, the volume control signal may include a setting where the gain applied to the audio source signal is zero, or may contain an indication that the audio signal is silence or that the user does not currently wish for any audio signal to be played back. The ultrasonic signal component may then be a maximum amplitude.

In some embodiments the gain applied to the ultrasonic signal may be adjusted in a continuous or quasi-continuous fashion, by a numerical calculation using a predefined gain law or by a look-up table embodying a pre-determined gain characteristic. In other embodiments, the gain to be applied may be limited to a small number of discrete levels, say two or less than 8.

Figure 6:
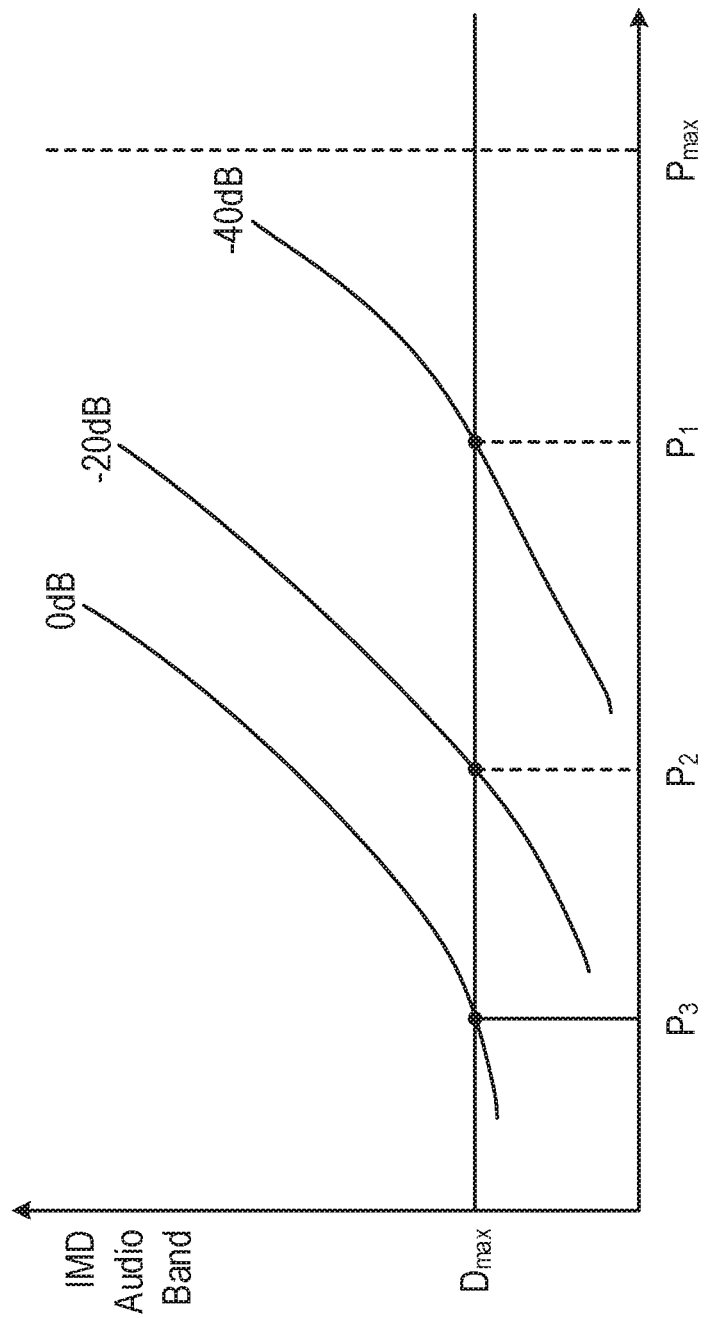
FIG. 6 illustrates an effect of driving an audio signal and an ultrasonic signal concurrently.

The gain law to be applied for a particular transducer may be derived by computer modelling of the non-linearities, or empirically from measurement FIG. 6 illustrates the total power of audio band intermodulation products versus power of the ultrasonic components in the presence of various amounts of concurrently applied audio signal of a particular frequency, say 9 kHz. In the absence of any audio component, an ultrasonic signal component power of Pmax may be allowed to be delivered, limited by other effects, for example the maximum power of the amplifier, or some specified acoustic safety limit or maximum power that the speaker can handle without over-temperature issues.

Figure 7:
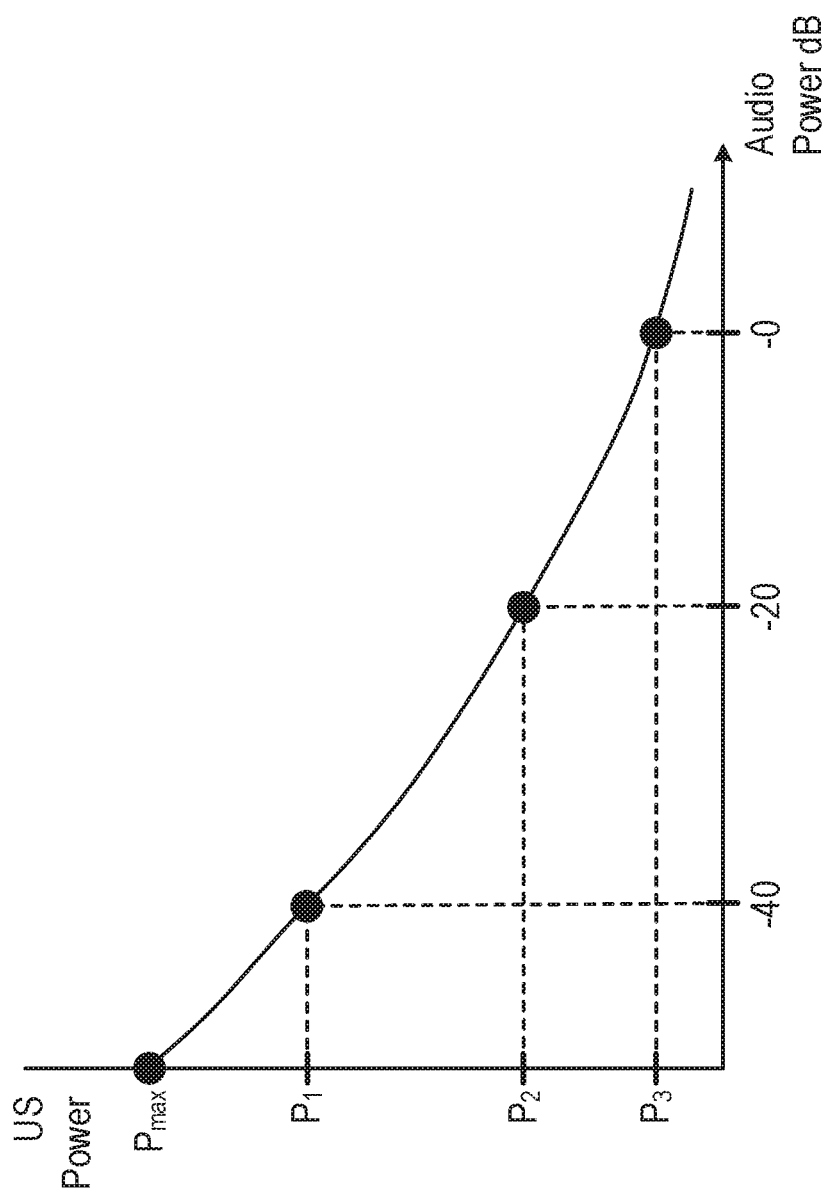
FIG. 7 illustrates a relationship between ultrasonic power and audio power in the circuitry of FIG. 4.

If a −40 dB audio signal is applied, it may be found from measurement that an ultrasonic stimulus of power P1 will give rise to a total audio band distortion power equal to some specified limit Dmax. Audio signals of power −20 dB or 0 dB may give similar audio band distortion power for ultrasonic powers of P2 and P3 respectively. Thus a plot of maximum ultrasonic power versus audio band component power may be derived as illustrated in FIG. 7, from which the required attenuation to be applied to a source signal of power Pmax may be derived and interpolated.

As discussed above, rather than actually generating an ultrasonic source signal Vu and explicitly adjusting a gain applied to generate an ultrasonic component signal Cu, in some embodiments the ultrasonic component signal Cu may be directly generated with an appropriate amplitude. In some embodiments, the ultrasonic component signal Cu may be generated from a stored waveform, for instance comprising the waveform of a complete burst of signal, to which gain is applied. In some embodiments, the ultrasonic component signal Cu may be generated by selecting from a plurality of stored waveforms corresponding to a set of respective amplitudes or effective gain value settings.

By reducing the amplitude of the ultrasonic components of the output signal provided to the transducer when large amplitude audio components require to be reproduced, the combined signal may be maintained within a certain maximum amplitude, and thus avoid clipping of the combined signal in the output amplifier and resulting audio artifacts. From a user perspective, the automatic adjustment of the ultrasonic component amplitude also allows louder music playback than would be the case if a fixed larger margin were required to accommodate a fixed amplitude ultrasonic component.

However, while it is necessary for the combined signal not to exceed a certain maximum amplitude, i.e. to lie within a certain range, for example the full-scale range of a digital signal or the supply voltage of an analog amplifier, this is not a sufficient condition to avoid significant intermodulation components falling into the audio band. High amplitude intermodulation products may be found in the audio band even when the combined signal is well below a clipping level.

The issue may not be speaker excursion non-linearities, which are generally only significant for frequencies below the resonance of a loudspeaker, and usually require mainly limiting of the applied low frequency components of an audio signal. Even for a micro-speaker, the resonance frequency is generally under 1 kHz, yet these effects are apparent for frequencies around a decade above that, where speaker excursion is small.

However, reducing the level of the ultrasonic component may result in a loss in signal-to-noise ratio (SNR) of any resulting signal, for example a reflected signal, received by an acousto-electrical transducer, e.g. a microphone, in the host device, e.g. a smartphone. This may result in impaired parametric performance of any application relying on receiving and interpreting an ultrasonic signal, or even prevent functionality.

It is known to provide and process ultrasonic signals in the form of signals spread over a frequency band rather than single tone bursts. For example a chirp waveform may be used comprising a tone which is swept in frequency from a lower frequency to a higher frequency or vice versa or swept across a similar frequency range in both directions. The pulse compression gain of a chirp may be defined as $G_{PULSE} = T \, \Delta F$ where T is the duration of the pulse and $\Delta F$ is the bandwidth of the chirp, that is, the frequency span over which the tone is swept during the chirp. The effective gain may also be increased by increasing the repetition rate Frep of the pulse or chirp. The effective gain may also be increased by increasing the duty cycle of the pulse or chirp, given that the duty cycle is the product of the pulse duration and the repetition rate.

Thus parameters of the chirp waveform may be varied to increase the pulse compression gain of a chirp stimulus and hence improve the SNR. In embodiments, the bandwidth or pulse duration, duty cycle, or repetition rate or other parameter of the ultrasonic component Cu of the transmitted pulse may be varied in accordance with a parameter, e.g. level, of the audio component signal level. To regain the SNR lost by lowering the signal level, the duration of the pulse, or the duty cycle of a sequence of pulses, or the bandwidth or repetition rate of the chirp may be increased as the ultrasonic component signal level drops.

Figure 8:
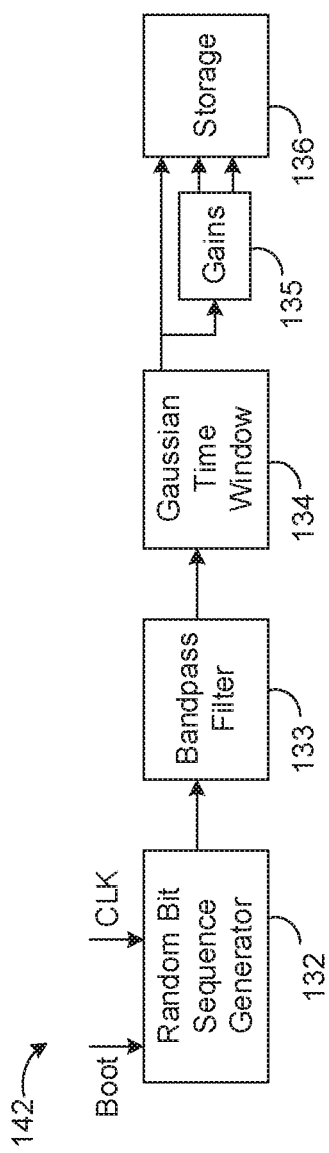
FIG. 8 illustrates an ultrasonic generation module.

In some embodiments ultrasonic signals other than chirp signals may advantageously be employed. FIG. 8 illustrates an ultrasonic signal generator 142 for generating wideband noise-like ultrasonic signals. Block 132 is a digital noise generator, for generating a noise sequence of values. In some embodiments, the digital noise generator is a noise generator (that is also used for different purposes) that takes a (possibly amplified) analog noise and digitises it to provide the noise source. In other examples, for example as illustrated in FIG. 8, the digital noise generator is a shift-register based pseudo-random sequence generator 132 as is known, which generates a random sequence of multi-bit values, which have a flat wideband frequency spectrum.

The bit sequence generator may be controllable, so that the range of the sample values, and hence the amplitude of the resultant pulse, is controllable. This bit sequence is passed through a band-pass filter 133 to limit the bandwidth to an ultrasonic range, for instance 20 kHz to 30 kHz. The band-pass filter 133 may be controllable, so that the bandwidth of the waveform is controllable. A window 134 selects an appropriate set of samples, corresponding to the duration of each ultrasonic pulse to be transmitted, for example 1024 samples at a 96 kHz sample rate for a 10.7 ms pulse width, possibly transmitted at an 80% duty cycle to give a 13.3 ms pulse repetition frequency. The window function 134 may be controllable, so that the pulse duration is controllable. This window may preferably be a Gaussian window or some similar smoothing window to prevent signal discontinuities at the start or end of each individual transmitted ultrasonic pulse.

Thus rather than a single tone, or even a chirp waveform sweeping through frequencies, the generated ultrasonic pulse will have a flat spectrum extending over a wide frequency range. Thus if any down-mixing to audio band does occur, it will be spread over the audio band as apparent audio band noise, rather than fixed or sweeping audio tones.

In some embodiments each transmitted ultrasonic pulse may be individually generated when required. However in some applications such as motion or gesture detection it may be advantageous for the same ultrasonic waveform to be transmitted every time, so that consecutive responses may be subtracted and only the difference signal analysed, to remove fixed echoes and select only reflections that change pulse by pulse, indicating relative movement of the reflecting object. Thus, the random sequence may be generated only once and the corresponding ultrasonic pulse waveform generated only once and stored in suitable memory circuitry 136.

The random sequence or even the ultrasonic waveform may be generated during manufacture of the driver circuitry or of a host device comprising it. Advantageously however, the random sequence may be generated infrequently, say on re-initialization of the ultrasonic signal generator for example on power-up or re-boot of a host device or re-start or re-enabling of the ultrasonic processing circuitry. In this way the ultrasonic pulse generated by the host device will be randomly distinct from that generated by other local host devices, reducing the chance of one device erroneously responding to pulses transmitted by another nearby device.

The amplitude of the generated or stored ultrasonic pulse waveform may be gain adjusted according to a gain value as described above. Alternatively, a set of waveforms generated by scaling an original waveform or by generating a set of appropriate amplitude waveforms as illustrated by Gain block 135, may be stored, and selected later as required.

In some instances, it may be advantageous for the waveforms used when there is no audio signal (or only a signal of a small amplitude) to be replayed, to be different from the waveforms used when an audio signal is to be played. For instance, a wideband noise-like waveform as above with a single fixed amplitude value, or an amplitude selected from a range of values, may be transmitted in the presence of an audio signal. However, a conventional chirp or even single tone may be adequate when there is no audio present and thus no chance of intermodulation of the ultrasonic signal with the audio signal. The increased amplitude when there is no audio present may give enough signal-to-noise benefit to allow a low, say 5%, duty cycle rather than 80% for the output driver amplifier and for receiver circuitry. This may significantly help average power consumption, and the simpler signal may also allow simpler lower-power processing of the received ultrasonic waveform.

Figure 9:
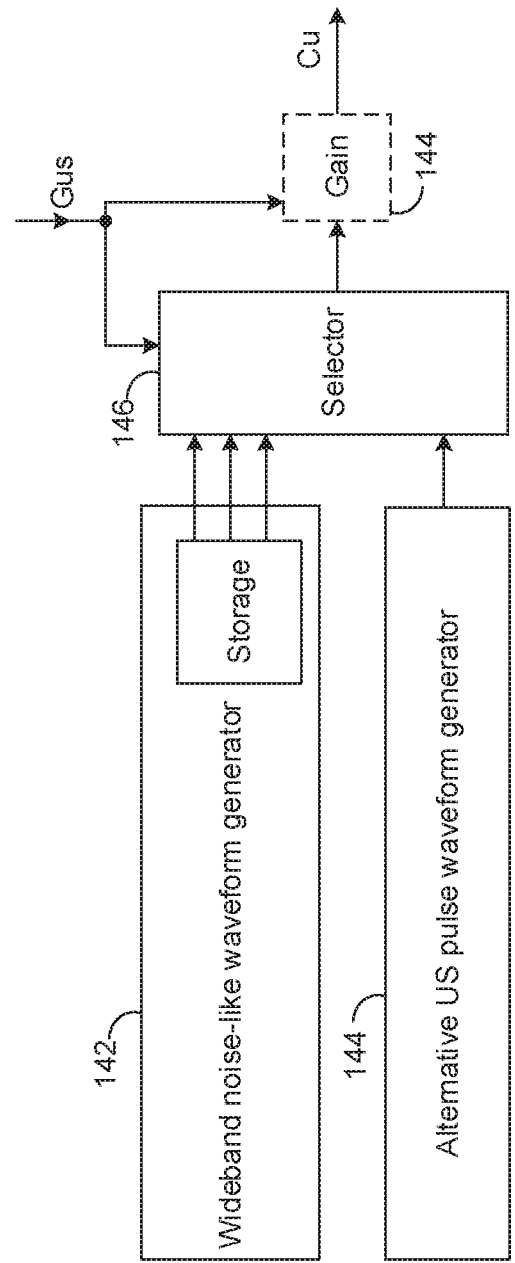
FIG. 9 illustrates a further ultrasonic generation module.

Thus, as illustrated in FIG. 9, the driver circuitry may comprise a first ultrasonic pulse waveform generator 142 which may generate a wideband noise-like waveform as described with reference to FIG. 8, and a second ultrasonic pulse waveform generator 144 which may generate a different (maybe simpler) ultrasonic pulse waveform such as a simple tone burst or chirp. The second waveform generator 144 may produce ultrasonic signal bursts at a lower duty cycle than the first, allowing a downstream amplifier to also operate at a lower duty cycle.

A control signal Gus controls whether to use the signal from the first generator or the second generator. In some embodiments control signal Gus may comprise information directly or indirectly conveying information about the presence of an input signal to be replayed. For instance a maximum value of a multi-bit gain control signal may indicate no signal or zero signal amplitude, or alternatively a dedicated control bit may convey this information, as a result of which the second signal generator may be selected.

In some embodiments, as illustrated, different stored waveforms may be selected from the first generator according to the control signal Gus, corresponding to different amplitudes or effective applied gains. In some embodiments the selected signal may be subject to gain as applied by illustrated optional gain block 144.

This description assumes that both pulse waveform generators are running continuously, with the control signal Gus being used to select the output from one of the two waveform generators. In other embodiments, the control signal Gus may be used to enable and disable the waveform generators, so that only one selected waveform generator is running at any one time.

FIG. 9 shows two separate pulse waveform generators. However, in practice, each pulse waveform generator may be implemented at least in part by suitable stored program code running on an appropriate processor. In that case, the two pulse waveform generators may be implemented by two components of program code running on one processor. Further, in that case, the control signal Gus may be used to select which of the two components of the program code is running on the processor, and therefore which one selected waveform generator is operating, at any one time.

In any of these embodiments, as described with reference to FIG. 9, the ultrasonic signal generation module may comprise a first waveform generator and a second waveform generator, and the ultrasonic signal generation module is configured to generate the ultrasonic component as an output of the first waveform generator when the value of the operational variable indicates that the level of the audio signal component is above a threshold level, and as an output of the second waveform generator when the value of the operational variable indicates that the level of the audio signal component is below the threshold level. More specifically, the first waveform generator may be configured for generating a waveform of a first type and the second waveform generator may be configured for generating a waveform of a second type, wherein the second type of waveform is simpler than the first type. Thus, the first type of waveform may be the wideband noise-like waveform as described with reference to FIG. 8, and the second type of waveform may be a simple tone burst or chirp. The second waveform generator may produce ultrasonic signal bursts with a higher amplitude, and with a lower duty cycle than the first waveform generator.

Figure 10:
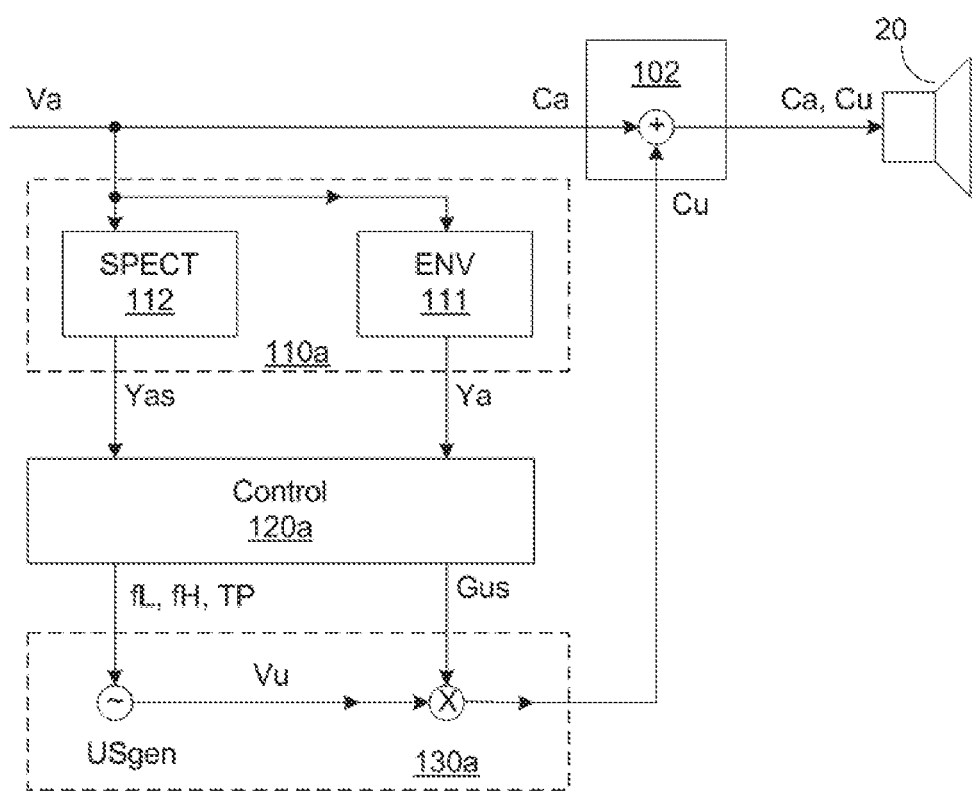
FIG. 10 illustrates a further electroacoustic transducer and associated driver circuitry.

FIG. 10 illustrates an embodiment where a control block 120a receives an envelope signal Ya from an envelope detector 111 in audio parameter extraction module 110a and generates therefrom not only a gain control signal Gus but also control signals defining appropriately adjusted chirp parameters comprising one or more of the lower frequency fL, upper frequency fH, pulse duration TP, pulse duty cycle, or repetition frequency Frep of the chirp waveform. In some embodiments the gain signal may modulate the amplitude of the chirp waveform as initially generated rather than first generating a normalized waveform and then scaling it, but such operation is equivalent to notionally generating a unity amplitude chirp signal and then scaling it to the appropriate amplitude.

In the case of the spectrum of the audio signal Ca being very wide, the ultrasonic signal can be spread over a wider bandwidth and hidden below the acoustic noise and hence regain the SNR.

In some embodiments the chirp waveform (or a wideband noise-like signal) may be allowed to be extended into the audio band, e.g. below 20 kHz, if it is judged that there is enough spectral energy in the audio signal in the relevant audio frequency bands to be able to psycho-acoustically mask the ultrasonic components. At least some of the spectrum of the ultrasonic chirp is then hidden in the audio signal, but can still be recovered by the processing gain of matched filtering. Thus in the presence of large enough audio signal the frequency range of the chirp may be extended further than otherwise possible, recovering some of the loss of SNR that would otherwise occur due to attenuation of the ultrasonic signal in the presence of such a large audio signal. Thus as illustrated in FIG. 10, embodiments may comprise a spectral analysis block 112 which generates data Yas used by the control block 120a to allow extension of the permissible lower limit of the lower chirp frequency when possible in view of some spectral parameters of the audio signal components.

As remarked above, the parameter extraction module 110a and the control module 120a may apply fast attack times, slow decay times, or hold times to the parameters or control signals to avoid excessive modulations of the ultrasonic signal gain. There may be further delay added to any signal to change the chirp amplitude or other parameters mid-chirp, i.e. such parameters may be allowed to change only in between successive chirp pulses. However, a delay in say reducing the chirp amplitude may result in some audible distortion. Thus, the chirp generation may be allowed to be interrupted or rapidly reduced in embodiments where this transient distortion is judged more important than the ultrasonic application.

A host device may comprise a transducer to capture received ultrasonic signals, for example reflected from some nearby object. The device may thus incorporate signal processing to process the received chirp waveform according to the expected frequency range and pulse duration.

Figure 11:
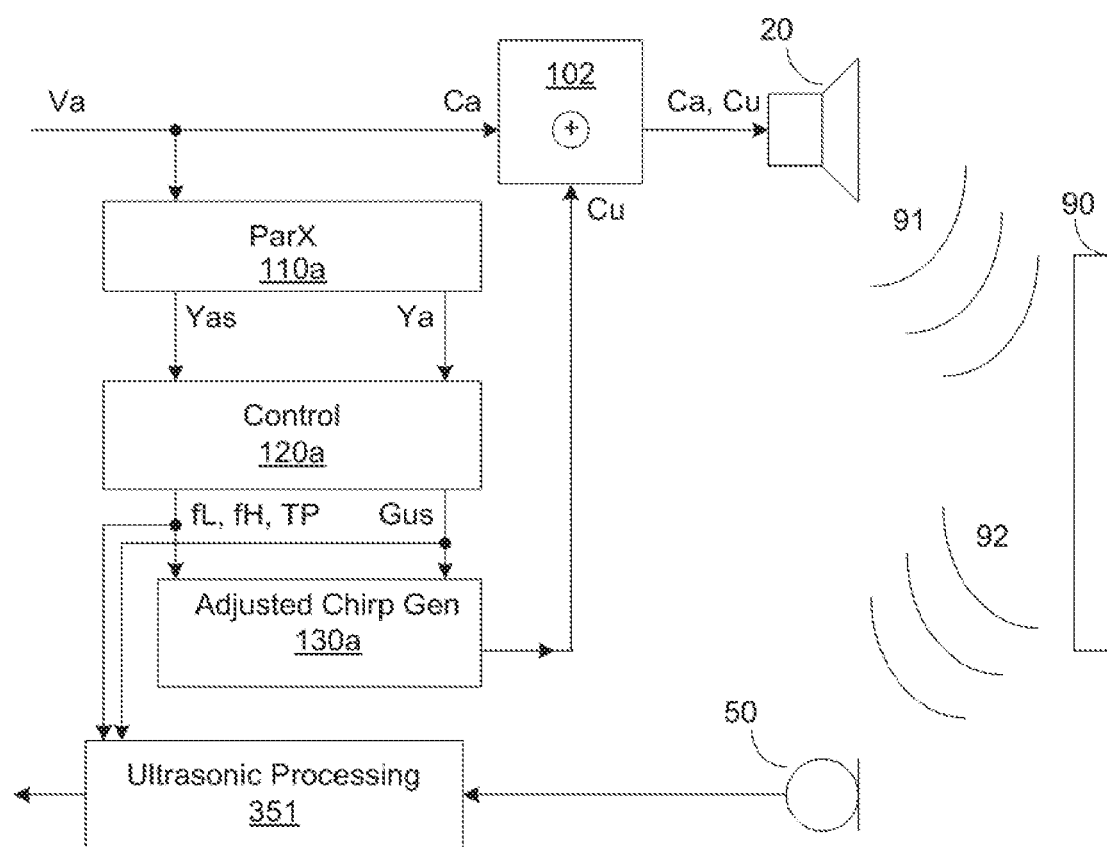
FIG. 11 illustrates a further electroacoustic transducer and associated driver circuitry.

FIG. 11 illustrates an embodiment in which the host device comprises a microphone 50 whose output is coupled to ultrasonic processing module 351. Ultrasonic processing module 351 is coupled to control module 120a to receive control parameters. In use the acoustic output 91 from speaker 20 may be reflected from some object 90 to produce reflected waves 92 which are picked up by microphone 50. The electrical output from microphone 50 is then processed by module 351.

The acoustic output 91 may comprise an acoustic ultrasonic chirp corresponding to ultrasonic component signal Cu generated by the Adjusted Chirp Generator 130a according to one or more of parameters Gus, fL, fH, TP or Frep from the control module 120a as derived from audio signal parameters Ya and/or Yas derived from the audio signal Va by parameter extraction module 110a. Thus the ultrasonic signal processing in module 351 is performed taking account of the audio-signal-dependent parameters Gus, fL, fH, TP or Frep of the ultrasonic component of the acoustic output.

Other methods and circuitry may be used to provide ultrasonic pulses with energy smeared over a bandwidth. Embodiments may use such signal formats for transmitted and received ultrasonic pulses with similarly variable signal generation parameters to provide variable pulse conversion gain in a similar way to chirp waveforms, for instance the length or repetition rate of a Barker Code modulated waveform.

Embodiments described above operate in a "feed-forward" fashion in which the ultrasonic signal adjustment, e.g. gain, has been based on a parameter indicative of the electrical audio component signal. Further embodiments may adjust the ultrasonic component signal based on parameters of the output transducer signal derived for example from the voltage and current of the transducer or from acoustic signals monitored by a microphone, e.g. on the host device or close to the output transducer. Yet further embodiments may operate where the ultrasonic component signal is adjusted using a combination of the feed-forward and feedback methods.

Figure 12:
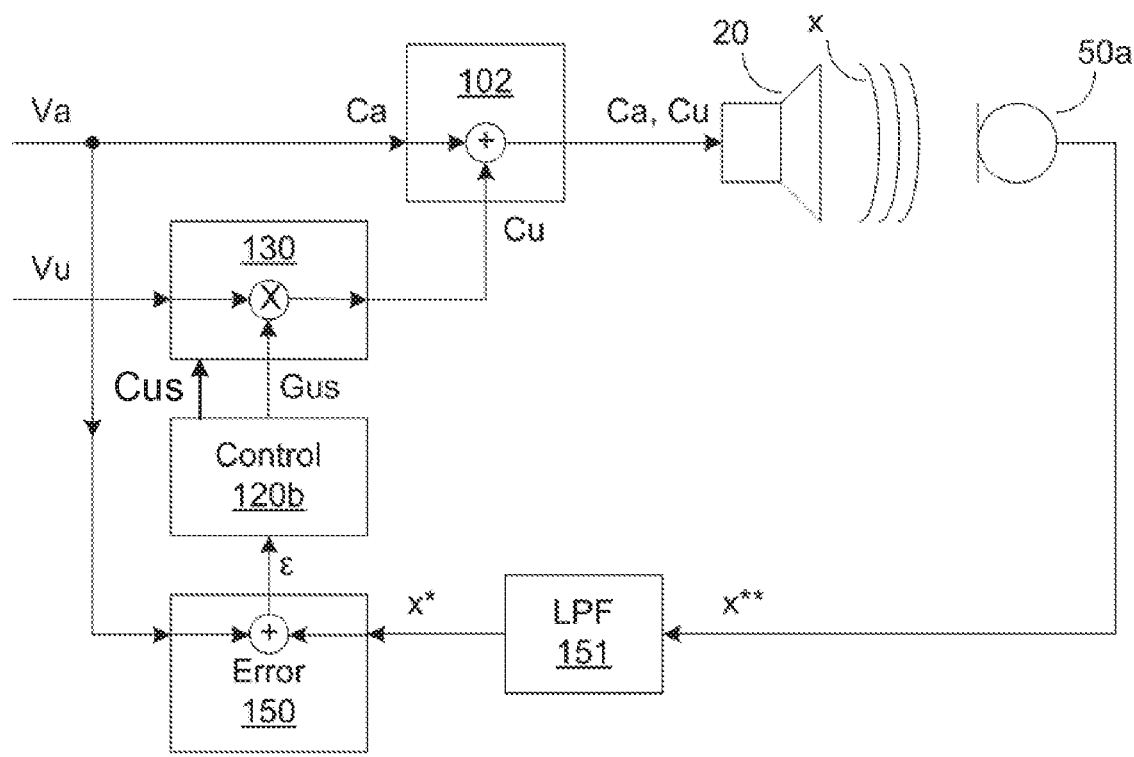
FIG. 12 illustrates a further electroacoustic transducer and associated driver circuitry.

FIG. 12 illustrates an embodiment in which an adaptive scheme is applied to the ultrasonic path in order to modify the ultrasonic signal in such a way that the down conversion terms are significantly reduced.

In this embodiment, a microphone 50a is provided adjacent to the speaker 20 to detect and reproduce the acoustic output signal x (rather than being positioned primarily to pick up an anticipated reflected signal). The electrical output x** from microphone 50a may be band-limited in a low-pass filter 151 to provide an estimated acoustic audio signal x* which has a similar bandwidth as the input audio source signal Va. The filtered acoustic signal x* is then compared to Va by comparison module 150 here illustrated simply as a subtractor.

In a simple embodiment, the signal adjustment module 130 is a gain element. The comparison signal ε generated by the comparison module 150 is then processed in a control block 120b to provide a gain control signal Gus to be applied by the adjustment module 130 to attenuate the ultrasonic component signal until the audio band error is below a specified limit.

In a more complex embodiment the signal adjustment module 130 may represent an adjustable non-linearity, which is adapted, for example using an adaptive iterative method. For example the non-linearity may be modified by a polynomial p(x). The m-th polynomial term $p_m$ is updated periodically, for example at every pulse or chirp by $$p_m \rightarrow p_m + \mu \cdot \varepsilon \cdot x^m$$

where μ is a convergence factor.

In some embodiments filtering may be applied to the error signal E.

As above, control block 120b may also provide other control signals Cus to the signal adjustment module 130 to adjust other parameters of the ultrasonic component signal Cu, for example the duration or duty cycle of ultrasonic signal bursts.

Figure 13:
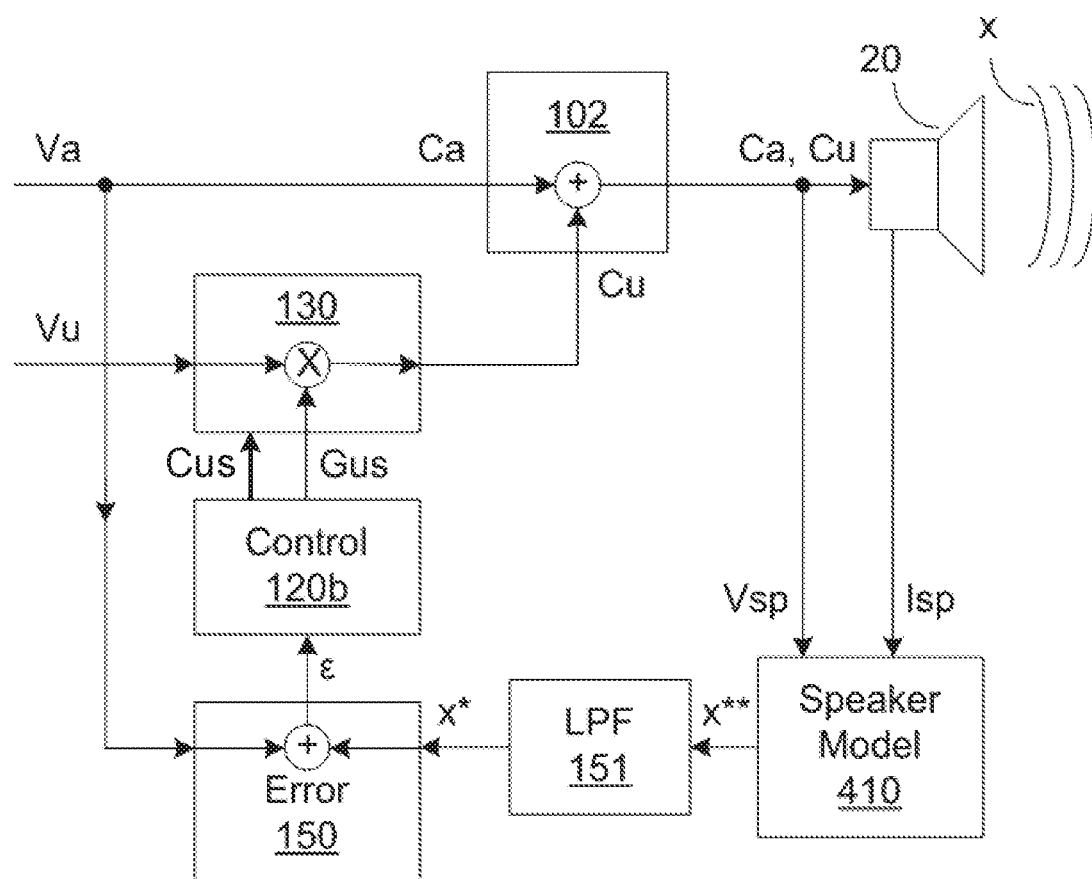
FIG. 13 illustrates a further electroacoustic transducer and associated driver circuitry.

FIG. 13 illustrates an embodiment in which an adaptive scheme is applied to the ultrasonic path in order to modify the ultrasonic signal in such a way that the down conversion terms are minimized.

In this embodiment, the speaker current Isp and speaker voltage Vsp are input to a speaker model module 410 in which a speaker plant model derives an estimated acoustic signal x, i.e., an estimate of the sound produced by the speaker. (This plant model may also be used for speaker excursion protection or speaker linearization purposes.) The estimated acoustic signal x may be band-limited by a low-pass filter 151 to a similar bandwidth as the input audio source signal Va. The filtered acoustic signal x* is then compared to Va by comparison module 150 here illustrated simply as a subtractor.

In some embodiments the voltage signal Vsp is derived directly from the combined signal that is generated in order to be applied to the speaker 20, possibly a digital signal, rather than taking the analog voltage imposed on the speaker and converting it to digital. In a simple embodiment scheme the signal adjustment module 130 is a gain element. The comparison signal ε generated by the comparison module 150 is then processed in a control block 120b to provide a gain control signal Gus to be applied by the signal adjustment module 130 so the ultrasonic US signal is reduced by enough to avoid audio band distortion products.

In a more complex embodiment the signal adjustment module 130 may represent an adjustable non-linearity, which is adapted, as described above.

As above, control block 120b may also provide other control signals Cus to the signal adjustment module 130 to adjust other parameters of the ultrasonic component signal Cu, for example the duration or duty cycle of ultrasonic signal bursts.

In some devices, particularly where the transducer is driven from a boosted supply, the main audio path is subject to control by a speaker protection module to avoid damage to the transducer. Such modules may use a speaker plant model that may derive operational variables relating to the loudspeaker such as displacement of membrane, velocity of membrane, acceleration of membrane, or temperature of the voice coil. Any signal limiting to prevent excessive excursion may occur upstream of the signal Va and will tend to be at lower audio frequencies, where most speaker excursion components occur.

Figure 14:
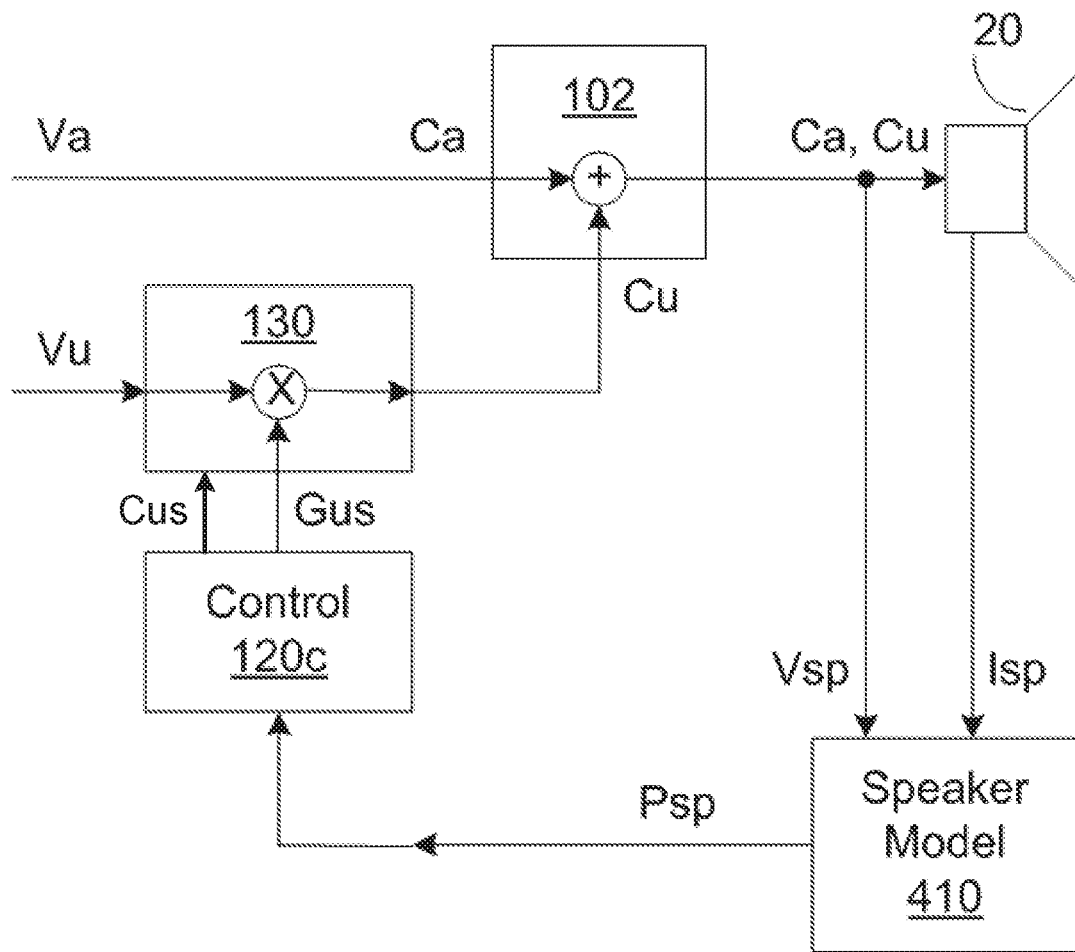
FIG. 14 illustrates a further electroacoustic transducer and associated driver circuitry.

Thus FIG. 14 illustrates a further embodiment in which the ultrasonic signal adjustment is controlled by operational speaker variables Psp such as displacement of membrane, velocity of membrane, acceleration of membrane, or temperature of the voice coil. These are derived by a speaker plant model 410 from inputs Vsp, Isp, representing the voltage and current in the voice coil of the speaker.

Specifically, FIG. 14 illustrates an embodiment in which an adaptive scheme is applied to the ultrasonic path in order to modify the ultrasonic signal in such a way that the down conversion terms are minimized. In this embodiment, speaker voltage and current Vsp and Isp are input to a speaker model module 410 which generates variables Psp. In a simple embodiment scheme the signal adjustment module 130 is a gain element. The parameters Psp are processed in a control block 120c to provide a gain control signal Gus to be applied by the signal adjustment module 130. Operation is similar to that of FIG. 13, except that one or more of the above operational speaker variables are used to detect possible distortion rather than an estimate of the acoustic output itself. As above, control block 120c may also provide other control signals Cus to the signal adjustment module 130 to adjust other parameters of the ultrasonic component signal Cu, for example the duration or duty cycle of ultrasonic signal bursts.

This may also assist in avoiding other issues from driving ultrasonic and audio components at the same time, e.g. excessive heating. Thus in some devices, particularly where the transducer is driven from a boosted supply, the main audio path is subject to control for speaker protection to avoid damage to the transducer. This audio signal cannot be adjusted without potentially damaging the speaker. Also from a 'HiFi' perspective we do not want to modify the processing of the audio components in transmit path unless absolutely necessary. Thus it is advantageous to modulate the ultrasonic signal components to regulate any thermal issues caused by the ultrasonic pulses rather than modulate the audio component in response to the power dissipated by the ultrasonic pulses.

Figure 15:
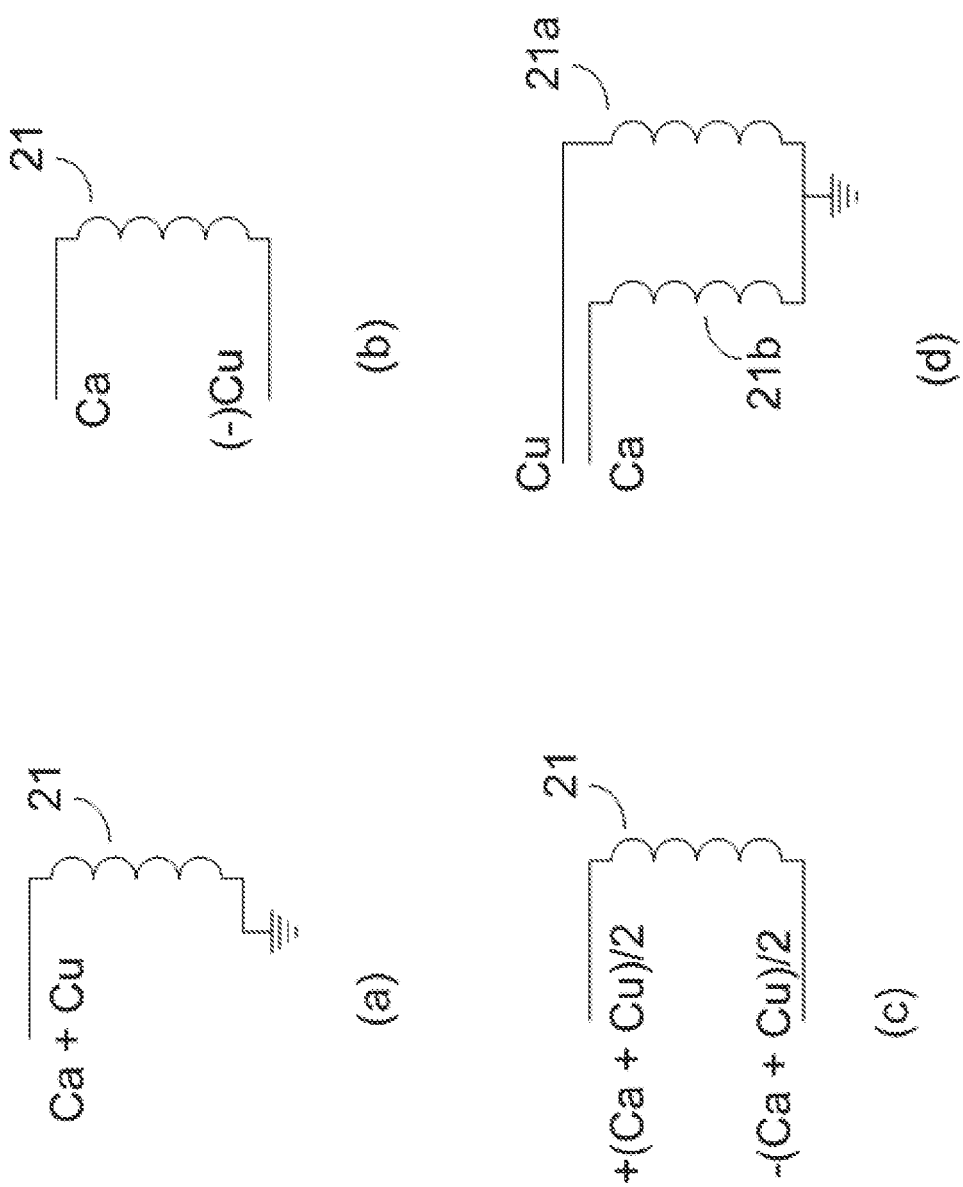
FIG. 15, views (a), (b), (c), and (d) illustrate circuitry for driving signals onto an electroacoustic transducer.

In embodiments described so far the components Ca and Cu are physically combined by combiner 102 or similar, for example a simple signal addition or summer, before being applied to the loudspeaker 20. In this case the summed signal might (after any required driver amplifier) be applied to one terminal of a voice coil 21 of a loudspeaker 20 and the other terminal connected to ground as illustrated in FIG. 15, view (a). It should be understood that the electrical signal components Ca and Cu may be transferred to the loudspeaker or other electro-acoustic transducer in other ways to provide an acoustic output comprising the required ultrasonic and audio components. For instance FIG. 15, view (b) illustrates the audio and ultrasonic components being applied separately to the two terminals of a voice coil 21. FIG. 15, view (c) illustrates the summed signal being applied differentially across two terminals of a voice coil. FIG. 15, view (d) illustrates the audio and ultrasonic components being applied to separate voice coils 21a and 21b, perhaps individually optimized for the respective frequency ranges. Variations of these connections will be apparent to those in the field. Other types of transducer, for example electrostatic or piezo-electric may be employed with equivalent connections. However in all cases there will be a common mechanical coupling to a structure such as a loudspeaker cone that will interface to the external air, and interaction between the two signals may cause intermodulation of the acoustic components.

As used herein, the term 'module' shall be used to at least refer to a functional unit or block of an apparatus or device. The functional unit or block may be implemented at least partly by dedicated hardware components such as custom defined circuitry and/or at least partly be implemented by one or more software processors or appropriate code running on a suitable general purpose processor or the like. A module may itself comprise other modules or functional units.

This software code may be stored in the device as firmware on some non-volatile memory (e.g., EEPROM) to preserve program data when the battery becomes discharged or is removed for replacement.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein.

The invention claimed is:

1. Driver circuitry, configurable to provide an output signal comprising an ultrasonic component and an audio signal component, the driver circuitry comprising:
    an ultrasonic signal generation module, responsive to an operational variable indicative of a level of said audio signal component, for generating the ultrasonic component;
    wherein an amplitude of the ultrasonic component is dependent on the level of said audio signal component such that a higher level of said audio signal component leads to a lower amplitude of the ultrasonic component, and a lower level of said audio signal component leads to a higher amplitude of the ultrasonic component;
    wherein at least one additional parameter of the ultrasonic component is dependent on the level of said audio signal component such that an increase in the level of said audio signal component leads to an increase in the at least one additional parameter, and a decrease in the level of said audio parameter leads to a decrease in the at least one additional parameter; and
    wherein the at least one additional parameter comprises at least one of:
        a pulse duration of the ultrasonic component;
        a duty cycle of the ultrasonic component;
        a repetition frequency of ultrasonic component;
        a frequency span of the ultrasonic component; and
        a bandwidth of the ultrasonic component.

2. Driver circuitry as claimed in claim 1 wherein said level of said audio component is indicated by an operational variable indicating the presence of an audio input signal receivable at an input.

3. Driver circuitry as claimed in claim 1 wherein said level of said audio component is indicated by an operational variable derived from an audio input signal received at an input.

4. Driver circuitry as claimed in claim 1 wherein said level of said audio component is indicated by an operational variable derived from an acousto-electrical transducer monitoring an acoustic output of the electroacoustic transducer.

5. Driver circuitry as claimed in claim 1 wherein said driver circuitry also comprises:
    an input for receiving an ultrasonic input signal; and
    said ultrasonic signal generation module is configured to control the level of said ultrasonic component signal by applying a controlled gain to said ultrasonic input signal.

6. Driver circuitry as claimed in claim 1, wherein said ultrasonic signal generation module is configured to generate an ultrasonic source signal and to generate the ultrasonic component signal by altering an amplitude of the ultrasonic source signal.

7. Driver circuitry as claimed in claim 6, wherein the ultrasonic signal generation module is configured to generate the ultrasonic source signal from a stored waveform.

8. Driver circuitry as claimed in claim 7, wherein the stored waveform comprises the waveform of a signal burst.

9. Driver circuitry as claimed in claim 7, wherein the ultrasonic signal generation module is configured to generate the stored waveform on re-initialization, and store it for subsequent use.

10. Driver circuitry as claimed in claim 7, wherein the ultrasonic signal generation module is configured to generate the stored waveform based on a random bit sequence.

11. Driver circuitry as claimed in claim 1, wherein said ultrasonic signal generation module is configured to generate the ultrasonic component with a required amplitude, and with a required pulse duration, duty cycle, repetition frequency and frequency span or bandwidth.

12. Driver circuitry as claimed in claim 11, wherein said ultrasonic signal generation module is configured to generate the ultrasonic component signal by selecting from a plurality of stored waveforms corresponding to a set of respective required characteristics.

13. Driver circuitry as claimed in claim 11, wherein said ultrasonic signal generation module comprises a first waveform generator and a second waveform generator, and wherein the ultrasonic signal generation module is configured to generate the ultrasonic component as an output either of the first waveform generator or of the second waveform generator, based on a value of said operational variable.

14. Driver circuitry as claimed in claim 13, wherein the first waveform generator is configured for generating a waveform of a first type and the second waveform generator is configured for generating a waveform of a second type, wherein the second type of waveform is simpler than the first type, and wherein the ultrasonic signal generation module is configured to generate the ultrasonic component as an output of the first waveform generator when the value of said operational variable indicates that the level of said audio signal component is above a threshold level.

15. Driver circuitry as claimed in claim 14, wherein the waveform of the first type is a wideband noise-like waveform.

16. Driver circuitry as claimed in claim 15, wherein the first waveform generator comprises:
- a digital noise generator, for generating a noise sequence of values;
- a band-pass filter, for receiving the noise sequence and limiting the bandwidth thereof to an ultrasonic range; and
- a window for selecting a set of samples output from the band-pass filter, corresponding to a required pulse duration.

17. Driver circuitry as claimed in claim 16, wherein the digital noise generator comprises a pseudo-random bit sequence generator, for generating a random sequence of values with a flat wideband frequency spectrum.

18. An electronic device comprising driver circuitry as claimed in claim 1.

19. The electronic device as claimed in claim 18, wherein the electronic device is at least one of: a portable device; a battery powered device; a communications device; a computing device; a mobile telephone; a laptop, notebook or tablet computer; a personal media player; a gaming device; and a wearable device.

20. A method of generating a transducer drive signal comprising an ultrasonic component and an audio signal component, the method comprising:
- determining an operational variable indicative of a level of the audio signal component; and
- generating the ultrasonic component;
- wherein an amplitude of the ultrasonic component is dependent on the level of said audio signal component such that a higher level of said audio signal component leads to a lower amplitude of the ultrasonic component, and a lower level of said audio signal component leads to a higher amplitude of the ultrasonic component;
- wherein at least one additional parameter of the ultrasonic component is dependent on the level of said audio signal component such that an increase in the level of said audio signal component leads to an increase in the at least one additional parameter, and a decrease in the level of said audio parameter leads to a decrease in the at least one additional parameter; and
- wherein the at least one additional parameter comprises at least one of:
  - a pulse duration of the ultrasonic component;
  - a duty cycle of the ultrasonic component;
  - a repetition frequency of ultrasonic component;
  - a frequency span of the ultrasonic component; and
  - a bandwidth of the ultrasonic component.

21. A computer program product, comprising a tangible medium, storing a computer program comprising computer-readable code for causing a processor to perform the method of claim 20.

22. An electronic device, comprising a processor and a memory, the memory storing a computer program for causing the processor to perform a method of generating a transducer drive signal comprising an ultrasonic component and an audio signal component, the method comprising:
- determining an operational variable indicative of a level of the audio signal component; and
- generating the ultrasonic component with an amplitude;
- wherein an amplitude of the ultrasonic component is dependent on the level of said audio signal component such that a higher level of said audio signal component leads to a lower amplitude of the ultrasonic component, and a lower level of said audio signal component leads to a higher amplitude of the ultrasonic component;
- wherein at least one additional parameter of the ultrasonic component is dependent on the level of said audio signal component such that an increase in the level of said audio signal component leads to an increase in the at least one additional parameter, and a decrease in the level of said audio parameter leads to a decrease in the at least one additional parameter; and
- wherein the at least one additional parameter comprises at least one of:
  - a pulse duration of the ultrasonic component;
  - a duty cycle of the ultrasonic component;
  - a repetition frequency of ultrasonic component;
  - a frequency span of the ultrasonic component; and
  - a bandwidth of the ultrasonic component.

* * * * *